United States Patent
Ueda

(10) Patent No.: US 7,864,495 B2
(45) Date of Patent: Jan. 4, 2011

(54) EXCESS VOLTAGE PROTECTION CIRCUIT, METHOD OF PROTECTING A CIRCUIT FROM EXCESS VOLTAGE, AND SEMICONDUCTOR APPARATUS HAVING THE EXCESS VOLTAGE PROTECTION CIRCUIT

(75) Inventor: Tadayoshi Ueda, Hyogo (JP)

(73) Assignee: Ricoh Company, Ltd., Tokyo (JP)

( * ) Notice: Subject to any disclaimer, the term of this patent is extended or adjusted under 35 U.S.C. 154(b) by 429 days.

(21) Appl. No.: 12/063,006

(22) PCT Filed: May 15, 2007

(86) PCT No.: PCT/JP2007/060322

§ 371 (c)(1),
(2), (4) Date: Feb. 5, 2008

(87) PCT Pub. No.: WO2007/142015

PCT Pub. Date: Dec. 13, 2007

(65) Prior Publication Data

US 2009/0091872 A1    Apr. 9, 2009

(30) Foreign Application Priority Data

Jun. 6, 2006    (JP) .............................. 2006-157454

(51) Int. Cl.
*H02H 9/00* (2006.01)
*H02H 3/20* (2006.01)
(52) U.S. Cl. ....................................... 361/58; 361/91.2
(58) Field of Classification Search ................... 361/58, 361/91.2
See application file for complete search history.

(56) References Cited

U.S. PATENT DOCUMENTS

| 3,405,319 | A | * | 10/1968 | Barringer | 361/60 |
| 3,754,182 | A | * | 8/1973 | Morris et al. | 323/299 |
| 4,835,649 | A | * | 5/1989 | Salerno | 361/18 |
| 4,914,540 | A |   | 4/1990 | Tabata et al. | |
| 5,463,521 | A | * | 10/1995 | Love | 361/58 |
| 5,513,060 | A | * | 4/1996 | Bremond | 361/58 |
| 5,585,991 | A |   | 12/1996 | Williams | |
| 5,946,270 | A | * | 8/1999 | Jang | 367/18 |

FOREIGN PATENT DOCUMENTS

| JP | 54-22550 | 2/1979 |
| JP | 57-75325 | 5/1982 |
| JP | 2001-258148 | 9/2001 |
| JP | 2002-218645 | 8/2002 |
| JP | 2002-313949 | 10/2002 |
| JP | 2003-75477 | 3/2003 |
| JP | 2003-303890 | 10/2003 |

OTHER PUBLICATIONS

Korean Office Action (9 pages).

* cited by examiner

*Primary Examiner*—Ronald W Leja
(74) *Attorney, Agent, or Firm*—Dickstein Shapiro LLP

(57) ABSTRACT

In a disclosed excess voltage protection circuit, when the input voltage equal to or higher than a predetermined maximum voltage is detected by an excess voltage detection circuit, a switching element is shut off so as to prevent the input voltage being output from the excess voltage protection circuit. A voltage obtained by dividing the input voltage using resistors is output from the excess voltage protection circuit.

18 Claims, 4 Drawing Sheets

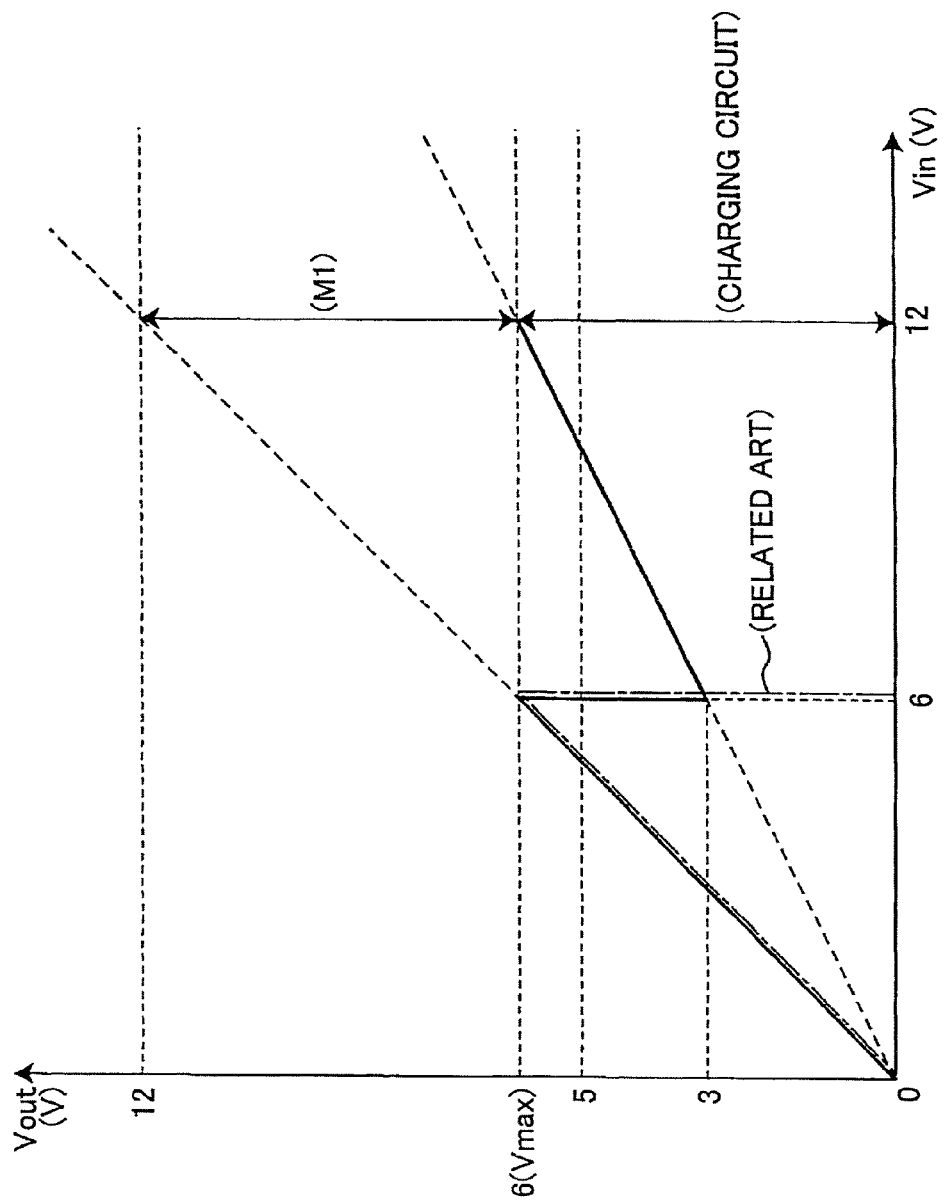

EXCESS VOLTAGE PROTECTION CIRCUIT, METHOD OF PROTECTING A CIRCUIT FROM EXCESS VOLTAGE, AND SEMICONDUCTOR APPARATUS HAVING THE EXCESS VOLTAGE PROTECTION CIRCUIT

TECHNICAL FIELD

The present invention relates to an excess voltage protection circuit that protects a circuit from excess voltage input to an input terminal, a method of protecting a circuit from excess voltage, and a semiconductor apparatus having the excess voltage protection circuit. Specifically, the present invention relates to an excess voltage protection circuit suitable to be incorporated in an apparatus that is energized by an AC adapter.

BACKGROUND ART

Currently, electrical appliances, such as a cellular telephone, a digital camera or the like, that incorporate rechargeable batteries are being widely used. When an AC adapter is connected to such an appliance, the appliance can operate on electric power supplied from an AC adapter, and at the same time the rechargeable battery can be charged. As such appliances have come into wider use, various AC adapters having different output voltages have come into use. Since limited types of connectors for the AC adapters are available, the AC adapters that output different voltages may have the same type of connector. Therefore, an improper AC adapter may be connected to an electrical appliance by mistake. If an AC adapter that outputs voltage higher than the endurance voltage of a semiconductor device in the electrical appliance is connected to the appliance, the semiconductor device may be damaged or broken.

In order to eliminate the above disadvantage, an excess voltage protection circuit shown in FIG. 1 has been developed (see Patent-related document listed below). In FIG. 1, an excess voltage protection circuit 113 is composed of resistors R111, R112 configured to divide the voltage output from an AC adapter 111, a resistor R113, a zener diode D111 that generates a reference voltage, a comparator 114 that compares the divided voltage obtained by dividing the voltage from the AC adapter 111 and the reference voltage, and a switching member M111 that is controlled to be turned on/off in accordance with the output voltage from the comparator 114. By the way, a resistor R114 serves as a bias resistor connected to the output terminal of the comparator 114, and a diode D112 indicates a parasitic diode of a PMOS transistor that composes the switching member M111.

When the AC adapter 111 that outputs an appropriate voltage is connected to the excess voltage protection circuit 113, electric potential is lower at an input IN1 than at an input IN2 of the comparator 114. In this case, the comparator 114 outputs a low level signal so as to cause the switch member M111 to be turned on, which allows the voltage output from the AC adapter 111 to be applied to an apparatus body 112. On the other hand, when the AC adapter 111 that outputs a higher voltage is accidentally connected to the excess voltage protection circuit 113, electric potential is higher at the input IN1 than the input IN2 of the comparator 114. In this case, the comparator 114 outputs a high level signal so as to cause the switch member M111 to be turned off, which prevents the higher voltage from being applied to the apparatus body 112.

FIG. 2 illustrates another related art excess voltage protection circuit (see Patent-related document 2 listed below). Referring to FIG. 2, the shown circuit includes an excess voltage protection circuit portion 121 and a CMOS IC circuit portion 122. The excess voltage protection circuit portion 121 and the CMOS IC circuit portion 122 share a semiconductor substrate. Terminals 131, 132, which are external terminals of the semiconductor apparatus, are connected to an external power source (not shown). Terminals 133, 134 are internal terminals of the semiconductor apparatus and serve as power source terminals for the CMOS Integrated Circuit (IC) 122. The excess voltage protection circuit portion 121 is composed of resistors R121, R122 that divide the power source voltage, a p-type Metal Oxide Semiconductor (PMOS) transistor M121 and a resistor R123, which compose an inverter, and a switching member M122.

When an appropriate voltage is applied across the terminals 131, 132, the voltage across the terminals of the resistor R122 is lower than a threshold voltage of the PMOS transistor M121. Therefore, the PMOS transistor M121 remains off and thus voltage across the resistor R123 is approximately 0 volts, which causes the switching member M122 composed of a PMOS transistor to remain on and the voltage input to the terminal 131 is then output to a terminal 133, thereby supplying electric power to the CMOS IC 122.

On the other hand, when a higher voltage is applied across the terminals 131, 132 and the voltage applied across the terminals of the resister R122 becomes larger than the threshold voltage, the PMOS transistor M121 is turned on. Then, the voltage across the resistor R123 becomes substantially equal to the voltage from the AC adapter 111, which causes the PMOS transistor M122 to be turned off, thereby stopping electric power from being supplied to the CMOS IC 122.

[Patent-related document 1] Japanese Patent Application Laid-Open Publication No. 2002-218645.

[Patent-related document 2] Japanese Patent Application Laid-Open Publication No. 2002-313949.

[Patent-related document 3] Japanese Patent Application Laid-Open Publication No. 2003-303890.

DISCLOSURE OF THE INVENTION

In the above circuits, transistors used in the switching member M111 in FIG. 1 and the switching member M122 in FIG. 2 must have a high endurance voltage. Besides, since the transistors have to allow a large current to flow through to the apparatus body 112 or the CMOS IC circuit 122, those transistors tend to be larger in size. Specifically, since endurance voltage and a current drive capability are in a trade-off relationship, a transistor that must have a high endurance voltage requires a larger size in order to realize a high current drive capability at the same time. For example, a transistor having a maximum rated endurance voltage of 15 volts and a current drive capability of 850 mA needs ten times larger the area, when compared with a transistor having a maximum rated endurance voltage of 7 volts and a current drive capability of 850 mA. Namely, when the related art excess voltage protection circuits are integrated into an IC chip, there is a disadvantage in that the chip has to be larger and expensive.

The present invention has been made in view of the above, and may provide an excess voltage protection circuit, a method of protecting a circuit from excess voltage, and a semiconductor apparatus having the excess voltage protection circuit that can reduce a chip size and production costs.

According to a first aspect of the present invention, there is provided a protection circuit configured to shut off an input voltage to a predetermined circuit when the input voltage becomes higher than or equal to a predetermined voltage. The protection circuit is composed of a switch configured to be turned on so as to allow the input voltage to be output to the predetermined circuit, or turned off so as to stop the input voltage from being output to the predetermined circuit; a detection circuit portion configured to detect the input voltage and cause the switch to be turned off when the detected voltage is higher than or equal to the predetermined voltage; and a reduced voltage generation circuit portion configured to output a reduced voltage to the predetermined circuit when the switch is turned off, the reduced voltage being changed in accordance with the input voltage.

In addition, the input voltage detection circuit portion may cause the switch to allow the input voltage to be output when the detected voltage is lower than the predetermined voltage.

The reduced voltage generation circuit portion may generate a reduced voltage that is lower than or equal to the endurance voltage of the predetermined circuit.

Specifically, the reduced voltage generation circuit portion may be composed of a voltage divider circuit portion that divides the input voltage to output the divided voltage as the reduced voltage.

More specifically, the reduced voltage generation circuit portion may generate a reduced voltage by halving the input voltage and output the halved voltage.

Additionally, the reduced voltage generation circuit portion may include a first resistor connected in parallel with the switch, and a second resistor connected between the output terminal of the switch and a ground terminal. In this case, when the switch is turned on the first resistor is short-circuited, thereby preventing the divided voltage from being output.

Moreover, the excess voltage protection circuit may include an excess voltage detection signal generation circuit portion that generates an excess voltage detection signal indicating that the input voltage is higher than or equal to the predetermined voltage and outputs the excess voltage detection signal to the predetermined circuit when the input voltage detection circuit portion causes the switch to be turned off.

The switch, the input voltage detection circuit portion and the reduced voltage generation circuit portion may be integrated in one IC chip.

Besides, the switch, the input voltage detection circuit portion, the reduced voltage generation circuit portion and the excess voltage detection signal generation portion may be integrated in one IC chip.

Specifically, the switch may be composed of a transistor capable of switching on/off in accordance with a control signal input to a control electrode of the transistor.

According to a second aspect of the present invention, there is provided a method of protecting a predetermined circuit from excess voltage. The method includes the steps of: turning off a switch so as to stop an input voltage from being output from the output terminal of the switch when the input voltage is higher than or equal to a predetermined voltage; and outputting a reduced voltage to the output terminal to the predetermined circuit, the reduced voltage being changed in accordance with the input voltage.

Additionally, the method may further include a step of turning on the switch so as to output the input voltage to the predetermined circuit when the input voltage is lower than the predetermined voltage.

In the step of outputting a reduced voltage, the reduced voltage may be output that is lower than or equal to the endurance voltage of the predetermined circuit.

Specifically, in the step of outputting a reduced voltage, the reduced voltage is generated by dividing the input voltage. More specifically, the reduced voltage is generated by halving the input voltage.

The method may further include a step of outputting an excess voltage detection signal indicating that the input voltage is higher than or equal to the predetermined voltage, to the predetermined circuit when the switch is turned off.

According to a third embodiment of the present invention, there is provided a semiconductor apparatus composed of: an internal circuit having a predetermined function; a switch configured to be turned on so as to allow the input voltage to be output to the internal circuit, or turned off so as to stop the input voltage from being output to the internal circuit; a detection circuit portion configured to detect the input voltage and cause the switch to be turned off when the detected voltage is higher than or equal to the predetermined voltage; and a reduced voltage generation circuit portion configured to output a reduced voltage to the internal circuit when the switch is turned off, the reduced voltage being changed in accordance with the input voltage.

Additionally, the input voltage detection circuit portion may cause the switch to allow the input voltage to be output when the detected voltage is lower than the predetermined voltage.

The reduced voltage generation circuit portion may generate a reduced voltage that is lower than or equal to endurance voltage of the internal circuit.

Specifically, the reduced voltage generation circuit portion is composed of a voltage divider circuit portion that divides the input voltage to output the divided voltage as the reduced voltage.

More specifically, the reduced voltage generation circuit portion may generate a reduced voltage by halving the input voltage and output the halved voltage.

The reduced voltage generation circuit portion may include a first resistor connected in parallel with the switch, and a second resistor connected between the output terminal of the switch and a ground terminal. In this case, when the switch is turned on the first resistor is short-circuited, thereby preventing the divided voltage from being output.

The semiconductor apparatus may further include an excess voltage detection signal generation circuit portion that generates an excess voltage detection signal indicating that the input voltage is higher than or equal to the predetermined voltage and outputs the excess voltage detection signal to the internal circuit when the input voltage detection circuit portion causes the switch to be turned off.

The internal circuit of the semiconductor apparatus may stop operating so as to reduce a consumption current therein upon receiving the excess voltage detection signal.

The internal circuit of the semiconductor apparatus may be a charging circuit that charges a rechargeable battery using the input voltage as a source voltage.

The switch of the semiconductor apparatus may be composed of a transistor capable of switching on/off in accordance with a control signal input to a control electrode of the transistor.

The internal circuit, the switch, the input voltage detection circuit portion and the reduced voltage generation circuit portion of the semiconductor apparatus may be integrated in one IC chip.

Additionally, the internal circuit, the switch, the input voltage detection circuit portion, the reduced voltage generation circuit portion and the excess voltage detection signal generation circuit portion may be integrated in one IC chip.

According to the embodiments of the present invention, when the input voltage is greater than or equal to a predetermined voltage, the switch shuts off so as to prevent the excess voltage from being output to the output terminal of the switch and a reduced voltage obtained in accordance with the input excess voltage is output to the output terminal of the switch. Therefore, endurance voltage of the switch can be reduced. Additionally, when the switch is a transistor, the transistor can be significantly downsized and an IC chip incorporating the transistor can also be downsized, thereby reducing production costs.

Moreover, a transistor used in the input voltage detection circuit portion in which only a minute current flows must have a high endurance voltage. In addition, since the reduced voltage generation portion can be configured only by the two resistors, the chip area can be greatly reduced.

Since the reduced voltage applied to the switch output terminal is about half the input voltage, when the transistor is used as the switch, this transistor can have the same endurance voltage as a transistor used in the circuit to which the input voltage is applied, thereby providing greater efficiency of circuit design and production. Additionally, the circuit subjected to protection can be protected even when a voltage twice the endurance voltage of the circuit is input to the protection circuit.

BRIEF DESCRIPTION OF THE DRAWINGS

FIG. 4 illustrates relationships between an input voltage (Vin) and an output voltage (Vout) in the semiconductor device shown in FIG. 3.

BEST MODE FOR CARRYING OUT THE INVENTION

Referring to the accompanying drawings, an excess voltage protection circuit, a method of protecting a circuit from excess voltage, and a semiconductor apparatus having the excess voltage protection circuit according to embodiments of the present invention will be described.

Figure 1:
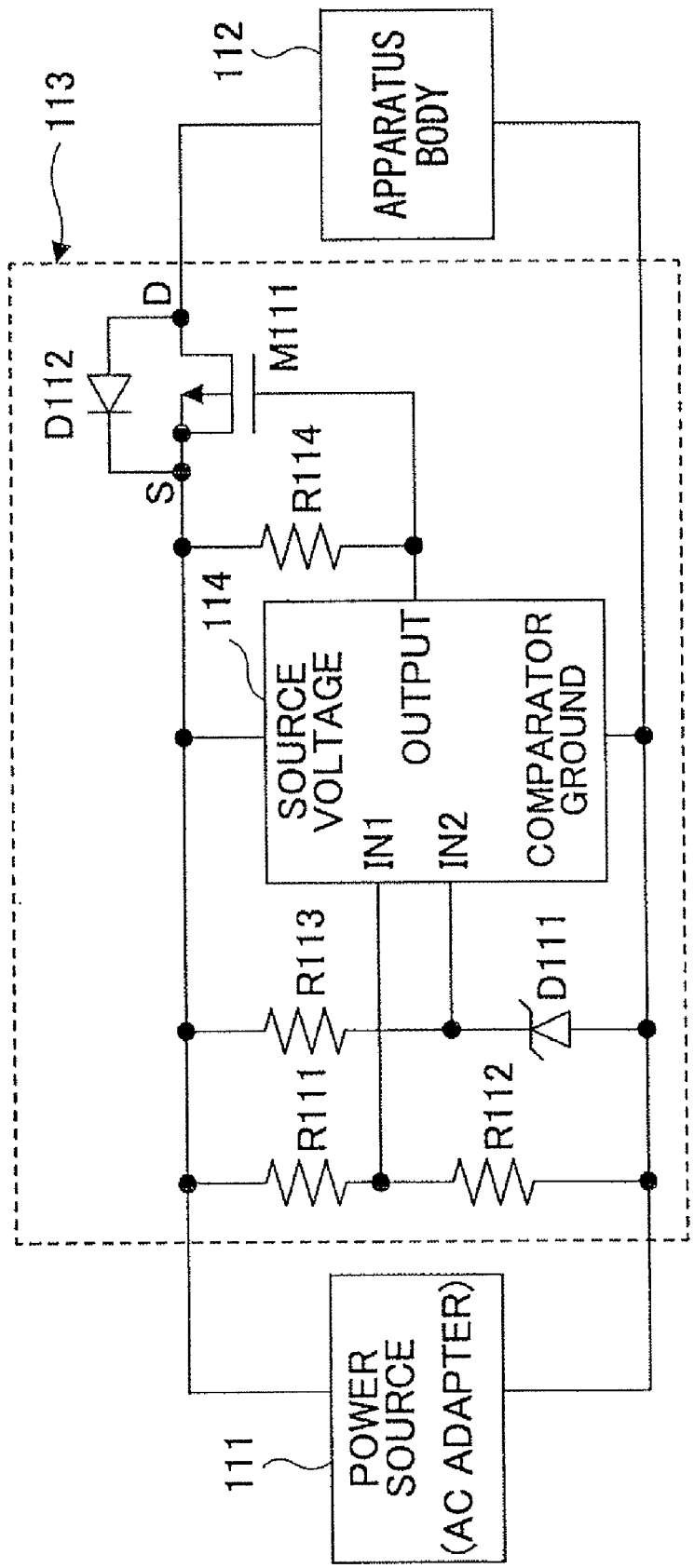
FIG. 1 illustrates a related-art excess voltage protection circuit.
Figure 2:
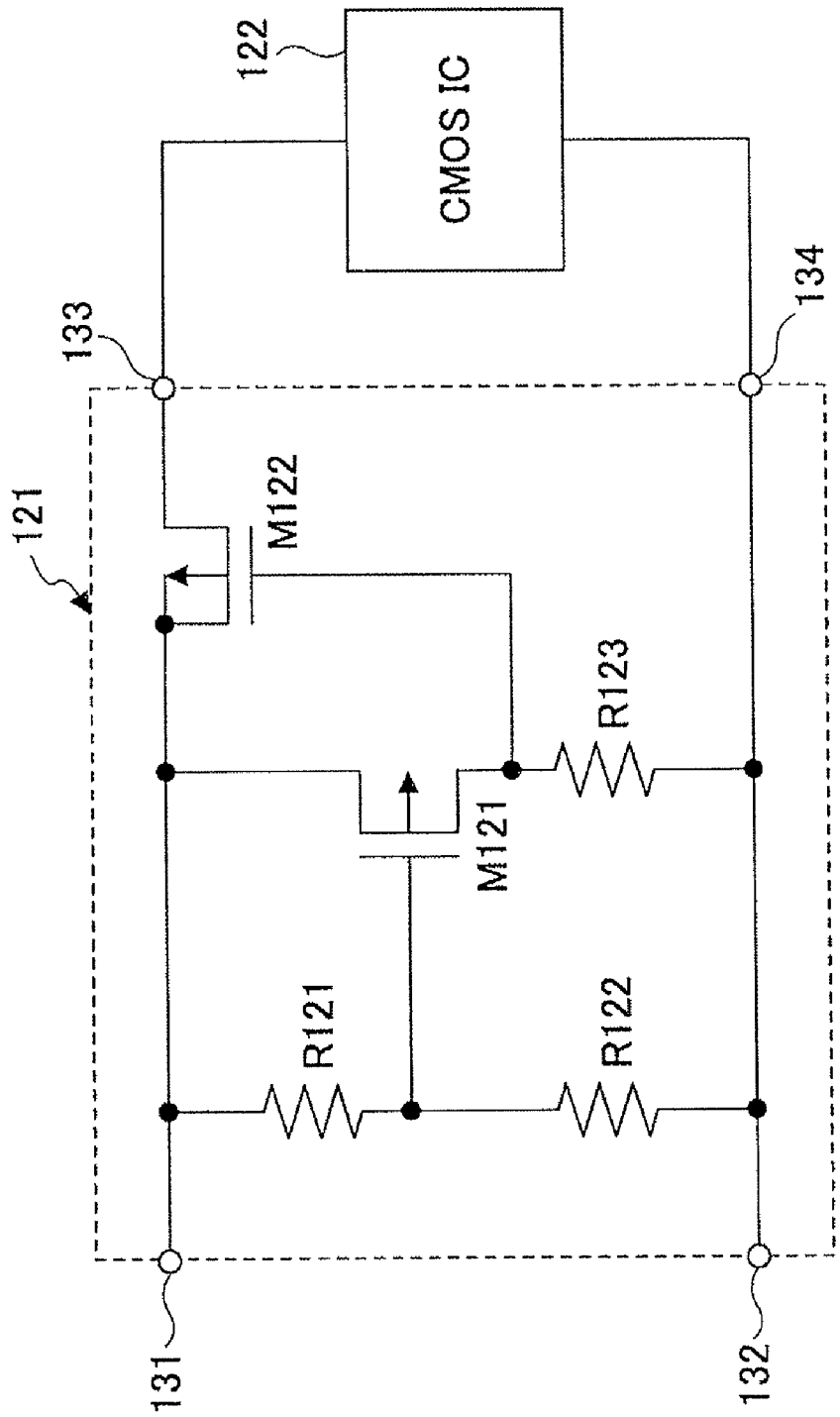
FIG. 2 illustrates another related-art excess voltage protection circuit.
Figure 3:
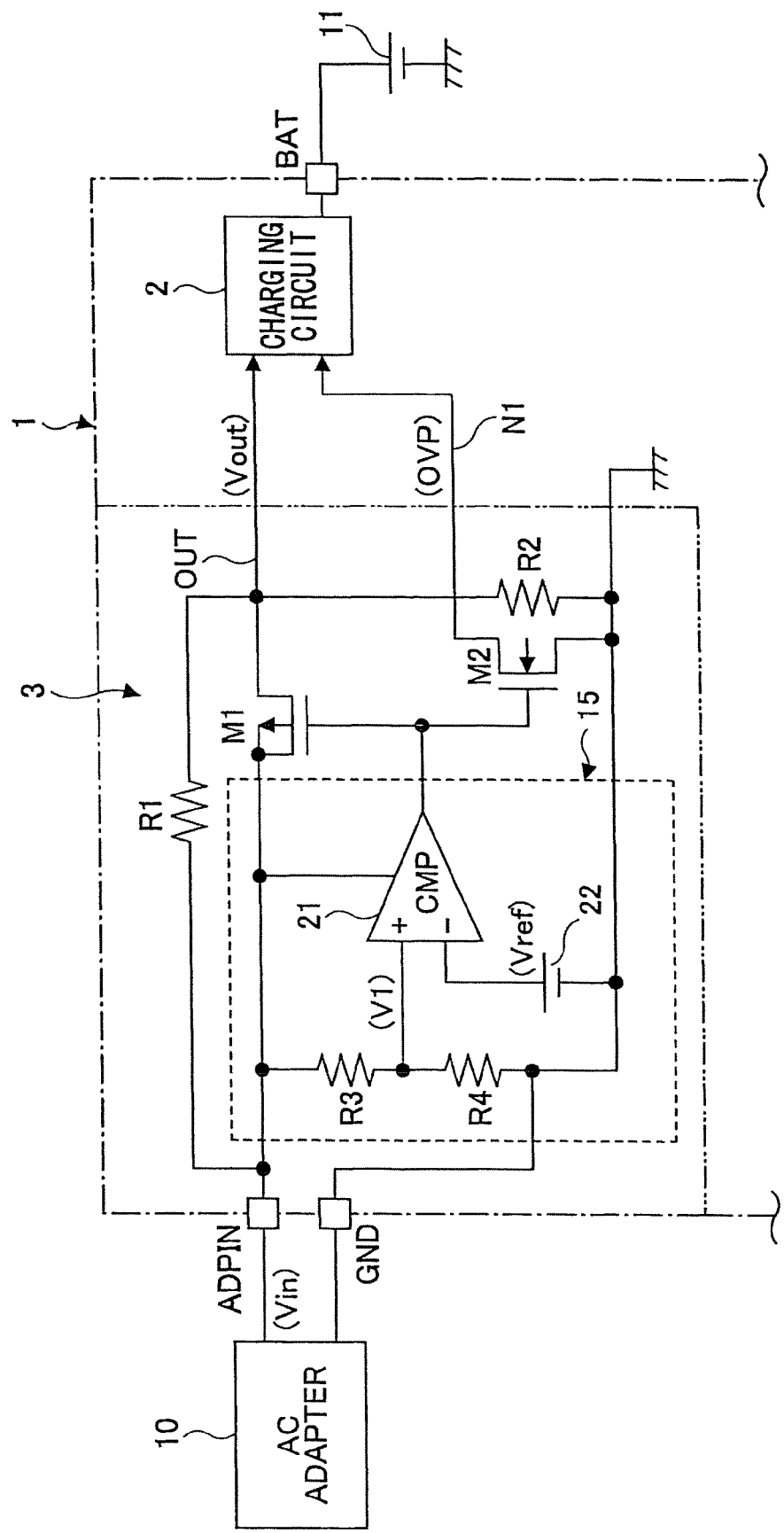
FIG. 3 illustrates a semiconductor apparatus incorporating an excess voltage protection circuit according to an embodiment of the present invention.

FIG. 3 shows an example of a semiconductor apparatus, which has an excess voltage protection circuit, according to an embodiment of the present invention. In this embodiment, the semiconductor apparatus is a battery charger. In FIG. 3, a semiconductor apparatus 1 uses as a power source an AC adapter 10 connected between a ground terminal GND and an input terminal ADPIN, so as to charge a rechargeable battery 11 connected to a connector terminal BAT. Specifically, the semiconductor apparatus 1 includes a charging circuit 2 which charges a rechargeable battery 11 by using the AC adapter 10 as a power source, and an excess voltage protection circuit 3 which protects the charging circuit 2 from excess voltage. By the way, the semiconductor apparatus 1 is formed on an IC chip.

When an input voltage Vin output from the AC adapter 10 is lower than a predetermined maximum voltage Vmax, the excess voltage protection circuit 3 outputs the input voltage Vin to the charging circuit 2 (a predetermined circuit or an internal circuit). When the input voltage is higher than or equal to the maximum voltage Vmax, the excess voltage protection circuit 3 prevents the input voltage Vin from being output to the charging circuit 2 and instead outputs a voltage obtained by dividing the input voltage Vin at a predetermined ratio to the charging circuit 2, thereby protecting the charging circuit 2. In addition, the excess voltage protection circuit 3 outputs an excess voltage detection signal OVP indicating that the excess voltage is detected when the input voltage Vin is higher than or equal to the maximum voltage Vmax, whereas the excess voltage protection circuit 3 shuts off the excess voltage detection signal OVP when the input voltage Vin is lower than the maximum voltage Vmax. Upon receiving the excess voltage protection detection signal OVP, the charging circuit 2 stops operating and reduces consumption current therein to approximately zero.

Specifically, the excess voltage protection circuit 3 includes a switching element M1 (a switch), a resistor R1 (a first resistor), a resistor R2 (a second resistor), an NMOS transistor M2 (an excess voltage detection signal generation circuit portion), and an input voltage detection circuit 15 (an input voltage detection circuit portion).

The switching element M1 is composed of a PMOS transistor that is switched on so as to supply the input voltage Vin to the charging circuit 2 or off so as to not supply the input voltage Vin to the charging circuit 2 in accordance with a control signal from the input voltage detection circuit 15. The resistors R1, R2 as a reduced voltage generation circuit portion generate a reduced voltage.

The input voltage detection circuit 15 is composed of a comparator 21 that controls the switching element M1 and the NMOS transistor M2, a reference voltage generation circuit 22 that generates a predetermined reference voltage Vref, a resistor R3, and a resistor R4. The input voltage detection circuit 15 detects the input voltage Vin and controls the switching element M1 and the NMOS transistor M2 in accordance with the detected voltage.

The switching element M1 is connected between the input terminal ADPIN and an output node OUT that is in turn connected to the charging circuit 2. In addition, the resistor R1 is connected between the input terminal ADPIN and the output node OUT; the resistor R2 is connected between the output node OUT and the ground terminal GND; the resistors R3, R4 are connected in series between the input terminal ADPIN and the ground terminal GND; and a connection node of the resistor R3 and the resistor R4 is connected to the non-inversion terminal of the comparator 21. The inversion terminal of the comparator 21 is connected to the reference voltage generation circuit 22. The output terminal of the comparator 21 is connected to the gates of the switching element M1 and NMOS transistor M2, the drain of the NMOS transistor M2 is connected to the charging circuit 2 via a node N1, and the source of the NMOS transistor M2 is connected to the ground terminal GND. The comparator 21 is energized by the input voltage Vin as a source voltage input to the input terminal ADPIN. The charging circuit 2 operates on the voltage Vout at the output node OUT as a source voltage.

In such a configuration, the resistors R3, R4 divide the input voltage Vin to produce a divided voltage V1 that is in turn input to the non-inversion terminal of the comparator 21. When the divided voltage V1 is lower than the reference voltage Vref input from the reference voltage generation circuit 22 to the inversion terminal of the comparator 21, namely, when the input voltage Vin is lower than the maximum voltage Vmax, the comparator 21 outputs a low level signal so as to cause the switching element M1 to be turned on and the NMOS transistor M2 to be turned off. In this case, since the resistor R1 is short-circuited by the switching element M1, the voltage Vout at the output node OUT is equal to the input voltage Vin. In this manner, the input voltage Vin from the AC adapter 10 is supplied to the charging circuit 2 via the output node OUT, while the node N1 is at a high impedance state, and the charging circuit 2 can charge the rechargeable battery 11 using the input voltage Vin as a source voltage.

On the other hand, when the divided voltage V1 is higher than or equal to the reference voltage Vref, namely, when the input voltage Vin is higher than or equal to the maximum voltage Vmax, the comparator 21 outputs a high level signal so as to cause the switching element M1 to be turned off and the NMOS transistor M2 to be turned on. In this case, the voltage Vout at the output node OUT is equal to the divided voltage Vd obtained by dividing the input voltage Vin using the resistors R1, R2. At the same time, the excess voltage detection signal OVP is output from the NMOS transistor to the charging circuit 2 via the node N1, which causes the charging circuit 2 to stop operating.

The resistors R1, R2 are chosen so that the divided voltage Vd does not exceed an endurance voltage of a transistor used in the charging circuit 2 and at the same time the resistance values are sufficiently larger than the total impedance of components connected to the output node OUT. For example, when the resistors R1, R2 have the identical resistance values, the divided voltage Vd (or the voltage Vout at the output node OUT) is half the input voltage Vin. The halved voltage is applied to the switching element M1 and the charging circuit 2, as shown in FIG. 4, when the input voltage Vin is higher than or equal to the maximum voltage Vmax. In other words, the semiconductor apparatus 1 is securely protected until the input voltage Vin from the AC adapter 10 reaches twice the endurance voltage of the transistor that composes the charging circuit 2.

By the way, a solid line in FIG. 4 shows a relationship between the input voltage Vin and the voltage Vout at the output node OUT according to the embodiment of the present invention, whereas a dashed line shows the Vout-Vin relationship according to a related art excess voltage protection circuit. Additionally, in FIG. 4, the input voltage Vin from the AC adapter is 5 volts; the maximum voltage Vmax is 6 volts; and the absolute rated voltage of the input voltage Vin is 12 volts. Note that although FIG. 4 shows the relationship when the resistors R1, R2 have the identical resistance values, the values are not necessarily exactly the same as long as the same effect above is demonstrated.

The switching element M1 has to be chosen so as to output the maximum current that is required in the charging circuit 2, and have the same endurance voltage as the transistor that is used in the charging circuit 2. As stated above, since the endurance voltage of the switching element M1 can be reduced to half the endurance voltage that would be required if the resistors R1, R2 were not employed, a small-sized transistor can be chosen for the switching element M1.

On the other hand, the transistor used in the input voltage detection circuit 15 is chosen so as to have twice the endurance voltage required for the transistor used in the charging circuit 2. Specifically, when the normal input voltage Vin from the AC adapter 10 is 6 volts and the endurance voltage of both the switching element M1 and the charging circuit 2 are 7 volts, the absolute rated voltage of the input voltage Vin is 14 volts. Therefore, the transistor used in the input voltage detection circuit 15 is required to have an endurance voltage of 14 volts or more.

When the input voltage Vin becomes more than or equal to the maximum voltage Vmax and the divided voltage Vd appears at the output node OUT, the divided voltage Vd may still operate the charging circuit 2. In this case, operation of the charging circuit 2 may lead to a reduction in the voltage Vout. However, since the excess voltage detection signal OVP (low level) is output to the charging circuit 2 concurrently when the switching element M1 is turned off, so as to stop the operation of the charging circuit 2, no current consumption occurs in the charging circuit 2. Then, a voltage reduction across the resistor R1 becomes larger, which in turn reduces the voltage Vout at the output node OUT, thereby preventing the voltage applied to the switching element M1 from increasing.

Moreover, right after the AC adapter 10 is connected to the input terminal ADPIN and the ground terminal GND and before the input detection circuit 15 and the charging circuit 2 start operating, the input voltage is divided by the voltage divider circuit composed of the resistors R1, R2 and the divided voltage Vd appears at the output node OUT. Therefore, a higher voltage is prevented from being applied to the switching element M1 even right after the AC adapter 10 is connected thereto.

As stated above, in the excess voltage protection circuit according to the embodiment of the present invention, when the input voltage Vin equal to the predetermined maximum voltage Vmax or higher is detected by the excess voltage protection circuit 15, the switching element M1 is shut off and the voltage Vout obtained by dividing the input voltage Vin using the resistors R1, R2 is output the charging circuit 2. Additionally, since the voltage applied to the switching element M1 can be reduced only by adding the voltage divider circuit composed of the resistors R1, R2 connected in series with each other, a large size transistor is not required for the switching element M1, which in turn makes it possible to reduce the size of the IC chip having the excess voltage protection circuit incorporated. Moreover, the excess voltage protection circuit requires a high voltage endurance transistor only for the input voltage detection circuit thereof designed for a minute current, which reduces the chip area for the excess voltage protection circuit.

By the way, although the semiconductor apparatus 1 is a battery charger including the charging circuit 2 and the connector terminal BAT for the rechargeable battery 11 in the embodiment of the present invention, this does not limit the present invention. The semiconductor apparatus 1 may have another circuit to which the voltage Vout and the excess voltage detection signal OVP are applied, while the charging circuit 2 and the connector terminal BAT are removed. In addition, although the charging circuit 2 and the excess voltage protection circuit 3 can be integrated in the same IC chip, the charging circuit 2 and the excess voltage protection circuit 3 can be formed in individual ICs, which are then connected to each other to form the semiconductor apparatus 1.

Additionally, although the voltage divider circuit composed of the resistors R1, R2 that outputs the divided voltage Vd at the output node OUT is exemplified in the embodiment according to the present invention, this does not limit the present invention. As long as a reduced voltage in accordance with the input voltage Vin is output at the output node OUT when the switching element M1 is turned off, other circuit elements or devices can be used to compose the voltage divider circuit. For example, the voltage divider circuit can be composed of semiconductor devices instead of the resistors R1, R2.

The present application is based on Japanese Patent Application No. 2006-157454, filed on Jun. 6, 2006 with the Japanese Patent Office, the entire content of which is hereby incorporated by reference.

The invention claimed is:

1. A protection circuit configured to shut off an input voltage to a predetermined circuit when the input voltage becomes higher than or equal to a predetermined voltage, the protection circuit comprising:

a switch configured to be one of turned on so as to allow the input voltage to be output to the predetermined circuit, and turned off so as to stop the input voltage from being output to the predetermined circuit;

a detection circuit portion configured to detect the input voltage and cause the switch to be turned off when the detected voltage is higher than or equal to the predetermined voltage;

a reduced voltage generation circuit portion configured to generate a reduced voltage in accordance with the input voltage and output the reduced voltage to the predetermined circuit when the switch is turned off; and an excess voltage detection signal generation circuit portion that generates an excess voltage detection signal indicating that the input voltage is higher than or equal to the predetermined voltage and outputs the excess voltage detection signal to the predetermined circuit when the input voltage detection circuit portion causes the switch to be turned off.

2. The excess voltage protection circuit of claim 1, wherein the input voltage detection circuit portion causes the switch to allow the input voltage to be output when the detected voltage is lower than the predetermined voltage.

3. The excess voltage protection circuit of claim 1, wherein the reduced voltage generation circuit portion generates a reduced voltage that is lower than or equal to an endurance voltage of the predetermined circuit.

4. The excess voltage protection circuit of claim 1, wherein the reduced voltage generation circuit portion is comprised of a voltage divider circuit portion that divides the input voltage so as to output the divided voltage to the predetermined circuit when the switch is turned off.

5. The excess voltage protection circuit of claim 1, wherein the reduced voltage generation circuit portion generates a reduced voltage by halving the input voltage and outputs the halved voltage to the predetermined circuit when the switch is turned off.

6. The excess voltage protection circuit of claim 1, wherein the reduced voltage generation circuit portion includes a first resistor connected in parallel with the switch, and a second resistor connected between the output terminal of the switch and a ground terminal; and wherein when the switch is turned on the first resistor is short-circuited, thereby preventing the reduced voltage from being output.

7. The excess voltage protection circuit of claim 1, wherein the switch, the input voltage detection circuit portion and the reduced voltage generation circuit portion are integrated in one IC chip.

8. The excess voltage protection circuit of claim 1, wherein the switch, the input voltage detection circuit portion, the reduced voltage generation circuit portion and the excess voltage detection signal generation portion are integrated in one IC chip.

9. The excess voltage protection circuit of claim 1, wherein the switch comprises a transistor capable of switching on/off in accordance with a control signal input to a control electrode of the transistor.

10. A method of protecting a predetermined circuit from excess voltage, the method comprising the steps of:

turning off a switch so as to stop an input voltage from being output from the output terminal of the switch when the input voltage is higher than or equal to a predetermined voltage;

generating a reduced voltage in accordance with the input voltage so as to output the reduced voltage to the predetermined circuit; and outputting an excess voltage detection signal indicating that the input voltage is higher than or equal to the predetermined voltage to the predetermined circuit when the switch is turned off.

11. The method of claim 10, further comprising a step of turning on the switch so as to output the input voltage to the predetermined circuit when the input voltage is lower than the predetermined voltage.

12. The method of claim 10, wherein the reduced voltage is lower than or equal to an endurance voltage of the predetermined circuit.

13. The method of claim 10, wherein the reduced voltage is generated by dividing the input voltage.

14. The method of claim 13, wherein the reduced voltage is generated by halving the input voltage.

15. A semiconductor apparatus comprising:

an internal circuit having a predetermined function;

a switch configured to be one of turned on so as to allow an input voltage to be output to the internal circuit, and turned off so as to stop the input voltage from being output to the internal circuit;

a detection circuit portion configured to detect the input voltage and cause the switch to be turned off when the detected voltage is higher than or equal to a predetermined voltage;

a reduced voltage generation circuit portion configured to generate a reduced voltage in accordance with the input voltage and output the reduced voltage to the internal circuit when the switch is turned off; and an excess voltage detection signal generation circuit portion that generates an excess voltage detection signal indicating that the input voltage is higher than or equal to the predetermined voltage and outputs the excess voltage detection signal to the internal circuit when the input voltage detection circuit portion causes the switch to be turned off.

16. The semiconductor apparatus of claim 15, wherein the input voltage detection circuit portion causes the switch to be turned on when the detected voltage is lower than the predetermined voltage.

17. The semiconductor apparatus of claim 15, wherein the reduced voltage generation circuit portion generates a reduced voltage that is lower than or equal to an endurance voltage of the internal circuit.

18. The semiconductor apparatus of claim 15, wherein the reduced voltage generation circuit portion is comprised of a voltage divider circuit portion that divides the input voltage so as to output the divided voltage.

* * * * *